(12) United States Patent
Seo et al.

(10) Patent No.: US 7,339,232 B2
(45) Date of Patent: Mar. 4, 2008

(54) SEMICONDUCTOR DEVICE HAVING MULTI-BIT NONVOLATILE MEMORY CELL AND METHODS OF FABRICATING THE SAME

(75) Inventors: Bo-Young Seo, Anyang-si (KR); Hee-Seog Jeon, Hwaseong-si (KR); Sung-Taeg Kang, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 76 days.

(21) Appl. No.: 11/256,554

(22) Filed: Oct. 21, 2005

(65) Prior Publication Data
US 2006/0092705 A1    May 4, 2006

(30) Foreign Application Priority Data
Oct. 28, 2004    (KR) .................. 10-2004-0086765

(51) Int. Cl.
*H01L 29/76*    (2006.01)
(52) U.S. Cl. ............... 257/319; 257/331; 257/347; 257/E27.06
(58) Field of Classification Search ......... 257/315, 257/316, 319, E27.06, 331, 347
See application file for complete search history.

(56) References Cited

U.S. PATENT DOCUMENTS

| 6,052,310 | A | 4/2000 | Sunkavalli |
| 6,275,415 | B1 | 8/2001 | Haddad et al. |
| 6,306,708 | B1 | 10/2001 | Peng ..................... 438/266 |
| 6,580,124 | B1* | 6/2003 | Cleeves et al. ......... 257/331 |
| 2003/0146465 | A1* | 8/2003 | Wu ......................... 257/314 |
| 2006/0226468 | A1* | 10/2006 | Zheng .................... 257/315 |
| 2007/0141781 | A1* | 6/2007 | Park et al. .............. 438/257 |

FOREIGN PATENT DOCUMENTS

| JP | 8-23040 | 1/1996 |
| KR | 10-2003-0065864 A | 8/2003 |

\* cited by examiner

*Primary Examiner*—T. N. Quach
(74) *Attorney, Agent, or Firm*—F. Chau & Associates, LLC.

(57) ABSTRACT

A semiconductor device having a multi-bit nonvolatile memory cell is provided. The semiconductor device comprises a multi-bit nonvolatile memory unit cell sharing a source and a drain region and having a plurality of transistors. The plurality of transistors each comprise at least one control gate and at least one charge storage region. The charge storage regions are for accumulating charges within each of the plurality of transistors of the memory unit cell. Each of the control gates are connected to at least one control voltage to shift a threshold voltage in each of the plurality of transistors for storing multi-bit per unit cell.

22 Claims, 8 Drawing Sheets

SEMICONDUCTOR DEVICE HAVING MULTI-BIT NONVOLATILE MEMORY CELL AND METHODS OF FABRICATING THE SAME

This application claims priority to Korean Patent Application No. 10-2004-0086765 filed on Oct. 28, 2004, the disclosure of which is incorporated herein by reference in its entirety.

BACKGROUND OF THE INVENTION

1. Field of the Invention

The present invention relates to a semiconductor device and a method of fabricating the same, and more particularly, to a semiconductor device having a multi-bit nonvolatile memory cell and to methods of fabricating the same.

2. Description of the Related Art

Flash memories are nonvolatile memory devices that retain memorized information even when the power is interrupted in these devices. EEPROM is a type of flash memory wherein all the memory cells can be erased at once. A significant demand exists for high integration of flash EEPROMs at a lower cost per megabyte (Mbyte). In this regard, a flash EEPROM composed of multi-bit transistors has been developed to meet the above needs in the industry.

A multi-bit transistor sets a multi-stage threshold voltage level, and each threshold voltage level represents a different state. However, for setting the multi-stage threshold voltage level in a flash EEPROM, initial erasing should be performed and the threshold voltage of each memory cell should be less than a minimum threshold voltage. After that, the threshold voltage of each memory cell should be increased to corresponding target threshold voltages in the sequence of a predetermined writing operation. Thus, feedback is required before a writing operation and therefore recording is a time consuming process. In addition, when using this multi-stage threshold voltage method, an operation allowable window becomes narrower. This means that the allowable range of operation is smaller. As such, the yield of fabricated chips is reduced. To widen the operation allowable window, the operating voltage can be increased but this may result in degradation of reliability.

SUMMARY OF THE INVENTION

According to an exemplary embodiment of the present invention, there is provided a nonvolatile semiconductor device comprising a multi-bit nonvolatile memory unit cell sharing a source and a drain region and having a plurality of transistors. The plurality of transistors comprise at least one control gate and at least one charge storage region. The charge storage regions are for accumulating charges within each of the plurality of transistors of the unit memory cell. Each of the control gates are connected to at least one control voltage for shifting a threshold voltage in each of the plurality of transistors.

According to another exemplary embodiment of the present invention, there is provided a nonvolatile semiconductor device comprising a multi-bit nonvolatile memory unit cell. The unit cell comprises a semiconductor body formed on a substrate and extending in a first direction, a channel region formed in the semiconductor body along a circumference of the semiconductor body, a charge storage region formed on the channel region, a plurality of control gates, which are formed on the charge storage region and wherein the plurality of control gates are each adapted to receive separate control voltages Also, Source and drain regions are aligned on both sides of the plurality of control gates and formed in the semiconductor body.

According to still another exemplary embodiment of the present invention, there is provided a nonvolatile semiconductor device comprising a pair of multi-bit nonvolatile memory unit cells. Each unit cell comprises a semiconductor body in which a plurality of parallel semiconductor bodies extend in a first direction and a plurality of parallel semiconductor bodies that extend in a second direction perpendicular to the first direction, a channel region formed in a partial region of the semiconductor body along circumferences of the semiconductor bodies that extend in the first direction, a charge storage region formed on the channel region, a plurality of control gates, which are formed on the charge storage region. Each of the plurality of control gates are adapted to receive separate control voltages. Further, source and drain regions are aligned on both sides of the plurality of control gates and formed in the semiconductor bodies. The pair of unit cells share the source region, and the source region is formed at a cross point of the grid.

According to another exemplary embodiment of the present invention, there is provided a method of fabricating a nonvolatile semiconductor device. The method including forming a semiconductor body on a substrate to extend in a first direction, forming a channel region in the semiconductor body along a circumference of the semiconductor body, forming a charge storage region on the channel region, forming a plurality of control gates on the charge storage region. The plurality of control gates are each adapted to receive separate control voltages. In addition, the method further comprises forming source and drain regions aligned on both sides of the plurality of control gates in the semiconductor body.

DETAILED DESCRIPTION OF THE PREFERRED EMBODIMENTS

The exemplary embodiments of the present invention will now be described more fully herein after with reference to accompanying drawings in which preferred embodiments of the invention are shown. The present invention may, how- FIG. 1 is an equivalent circuit diagram of a multi-bit nonvolatile memory cell of a semiconductor device according to an exemplary embodiment of the present invention.

Figure 1:
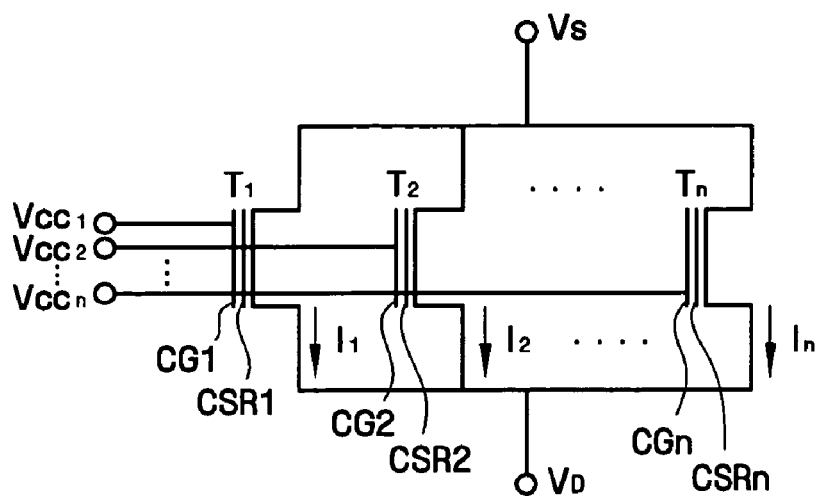
FIG. 1 is an equivalent circuit diagram of a multi-bit nonvolatile memory cell of a semiconductor device according to an exemplary embodiment of the present invention.

Referring to FIG. 1, the multi-bit nonvolatile memory cell of the semiconductor device according an exemplary embodiment of the present invention includes a plurality of transistors $T_1$, $T_2$, and $T_n$, which are connected in parallel to one another and constitute one unit cell.

Specifically, the plurality of transistors $T_1 T_2, \ldots,$ and $T_n$ include control gates CG1, CG2, ..., and CGn and charge storage regions CSR1, CSR2, ..., and CSRn disposed below the control gates CG1, CG2, ..., and CGn. The charge storage regions CSR1, CSR2, ..., and CSRn have either a floating trap structure in which a tunneling insulating layer, a charge trap layer and a blocking layer are stacked, or a floating gate structure in which a tunneling insulating layer, a floating gate and an intergate insulating layer are stacked.

The source S and drain D terminals of the transistors $T_1$, $T_2, \ldots,$ and $T_n$ are connected in parallel to one another. The control gates CG1, CG2 ..., and CGn are connected to control voltages CV1, CV2, ..., and CVn, respectively. Thus, in each of the plurality of transistors $T_1 T_2, \ldots,$ and $T_n$, charges are accumulated in the charge storage regions CSR1, CSR2, ..., and CSRn, e.g., floating gates or charge trap layers. Due to the charge accumulation, the threshold voltage of each of the plurality of transistors $T_1 T_2, \ldots,$ and $T_n$ is shifted so that programming can be performed in each of the plurality of transistors $T_1, T_2, \ldots,$ and $T_n$. Thus, when currents $I_1, I_2, \ldots,$ and $I_n$, which are to be driven according to each of the plurality of transistors $T_1, T_2, \ldots,$ and $T_n$, are different, 2-bit or more and n-bit or less storing can be performed.

A 3-bit data storage method, wherein there are three transistors $T_1$, $T_2$, and $T_3$ will now be described.

First, a program is made so that a threshold voltage of a selected transistor $T_1$, $T_2$, or $T_3$ is shifted using a channel hot electron injection (CHEI) method by which a saturated channel region is formed between the drain region D and the source region S of the selected transistors $T_1$, $T_2$, or $T_3$ and thermal electrons are accumulated in a selected charge storage region CSR1, CSR2 or CSR3. Thus, during programming, a voltage of about 3 to about 6V (e.g. 6V) is applied to the drain region D, a voltage of about 5 to about 10V (e.g. 7V) is applied to a selected control gate CG1, CG2 or CG3, and a ground voltage is applied to a substrate on which the source region S and the memory cell are formed. It is further noted that when a transistor is programmed it will be referred to herein as "on", and when a transistor is not programmed it will be referred to herein as "off".

Moreover, when a read operation is performed on a transistor $T_1$, $T_2$ or $T_3$ programmed in the above manner, a read voltage Vread that is larger than a predetermined threshold voltage of the non programmed transistor $T_1$, $T_2$ or $T_3$, and smaller than a threshold voltage of a programmed transistor $T_1$, $T_2$ or $T_3$ is applied to the control gates CG1, CG2, and CG3. In addition, a ground voltage is applied to the source region S, and an appropriate bias voltage is applied to the drain region D. For example, a voltage of about 1 to about 2V is applied to the control gates CG1, CG2, and CG3, and a voltage of about 0.4 to about 1 V is applied to the drain region D. When charges are accumulated in the charge storage region CSR1, CSR2 or CSR3 and a threshold voltage is shifted, that is, when the program state of a transistor is "on", a channel is not formed between the drain region D and the source region S, and a current does not flow through the drain region D and the source region S. On the other hand, when charges are not accumulated in the charge storage region CSR1, CSR2 or CSR3, that is, during when the program state of a transistor is "off", a channel is formed between the drain region D and the source region S and a current flows through the drain region D and the source region S.

The size of currents formed when transistors $T_1$, $T_2$ and $T_3$ are "off" is $I_1$, $I_2$, and $I_3$, respectively, and data can be stored as shown in Table 1.

TABLE 1

| Transistor Program State | | | Drain Detected Current | | |
|---|---|---|---|---|---|
| T1 | T2 | T3 | Amount | Current Level | Data |
| On | On | On | 0 | Icell_0 | 000 |
| On | On | Off | I3 | Icell_1 | 001 |
| On | Off | On | I2 | Icell_2 | 010 |
| Off | On | On | I1 | Icell_3 | 011 |
| On | Off | Off | I2 + I3 | Icell_4 | 100 |
| Off | On | Off | I1 + I3 | Icell_5 | 101 |
| Off | Off | On | I1 + I2 | Icell_6 | 110 |
| Off | Off | Off | I1 + I2_I3 | Icell_7 | 111 |

During a read operation, a current having one of 8 levels, Icell_0 to Icell_7, flowing through the drain region D can be detected based on a shift in the threshold voltage of one or more of the transistors $T_1$, $T_2$ and $T_3$. Thus, a data value of 000, 001, 010, 011, 100, 101, 101 or 111 can be outputted from a logic circuit as a drain current having one of 8 levels. In addition, 4-level currents can be selected from 8-level currents so that 00, 01, 10, and 11 data can be outputted.

When the size of currents formed by the transistors $T_1$, $T_2$ and $T_3$ in the "off" state is $I1=I2=I3$, an operating method shown in Table 2 can be performed.

TABLE 2

| Transistor Program State | | | Drain Detected Current | | |
|---|---|---|---|---|---|
| T1 | T2 | T3 | Amount | Current Level | Data |
| On | On | On | 0 | Icell_0 | 00 |
| On | On | Off | I3 = I2 = I1 | Icell_1 | 01 |
| On | Off | On | | | |
| Off | On | On | | | |
| On | Off | Off | I2 + I3 = I1 + I3 = I1 + I2 | Icell_2 | 10 |
| Off | On | Off | | | |
| Off | Off | On | | | |
| Off | Off | Off | I1 + I2 + I3 | Icell_3 | 11 |

That is, during a read operation, a current having one of four levels, Icell_0 to Icell_3, flowing through the drain region D can be detected, based on a shift in the threshold voltage of one or more of the transistors $T_1$, $T_2$ and $T_3$. Thus, 00, 01, 10, and 11 can be outputted from a logic circuit as a drain current having one of 4 levels.

When the size of the currents formed by two transistors in the off state among $T_1$, $T_2$ and $T_3$ is the same and the size of a current of the other transistor is different, an operation shown in Table 3 can be performed. In this case, Table 3 is based on the assumption that I3 is the same as I2. However, Table 3 can be applied to a case where any two of I1, I2, and I3 are the same.

TABLE 3

| Transistor Program State | | | | |
|---|---|---|---|---|
| T1 | T2 | T3 | Drain Detected Current Amount | Current Level |
| On | On | On | 0 | Icell_0 |
| On | On | Off | I3 = I2 | Icell_1 |
| On | Off | On | | |
| Off | On | On | I1 | Icell_2 |
| On | Off | Off | I2 + I3 | Icell_3 |
| Off | On | Off | I1 + I3 = I1 + I2 | Icell_4 |
| Off | Off | On | | |
| Off | Off | Off | I1 + I2_I3 | Icell_5 |

That is, during a read operation, a current having one of 6 levels, Icell_0 to Icell_5, flowing through the drain region D can be detected based on a shift in the threshold voltage of one or more of the transistors $T_1$, $T_2$ and $T_3$. Thus, 4-level currents can be selected from 6-level currents so that 00, 01, 10, and 11 data can be outputted.

The multi-bit nonvolatile memory cell shown in FIG. 1 can be implemented by a planar transistor cell or a nonplanar transistor cell. A nonplanar transistor cell having a smaller area is a more highly integrated semiconductor device, and thus a multi-bit nonvolatile memory cell implemented by this type of nonplanar transistor cell will be described in the following exemplary embodiments.

Figure 2:
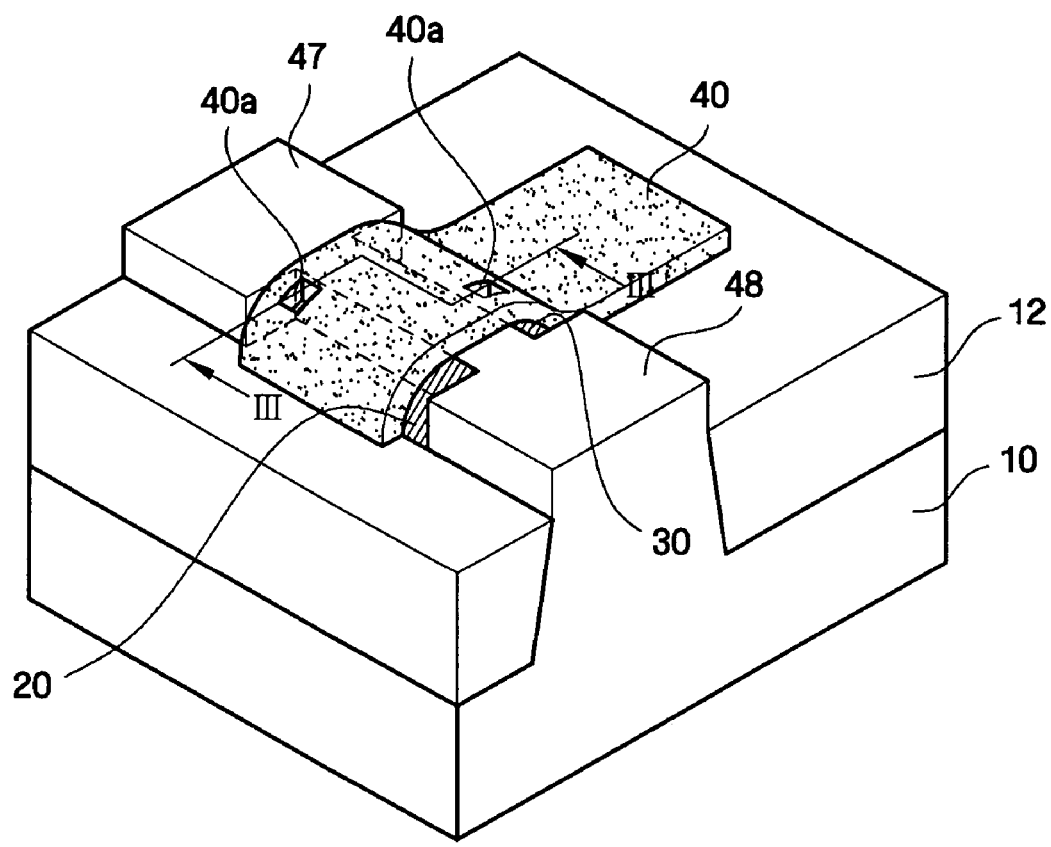
FIG. 2 is a perspective view of a multi-bit nonvolatile memory cell of a semiconductor device according to an exemplary embodiment of the present invention.
Figure 3:
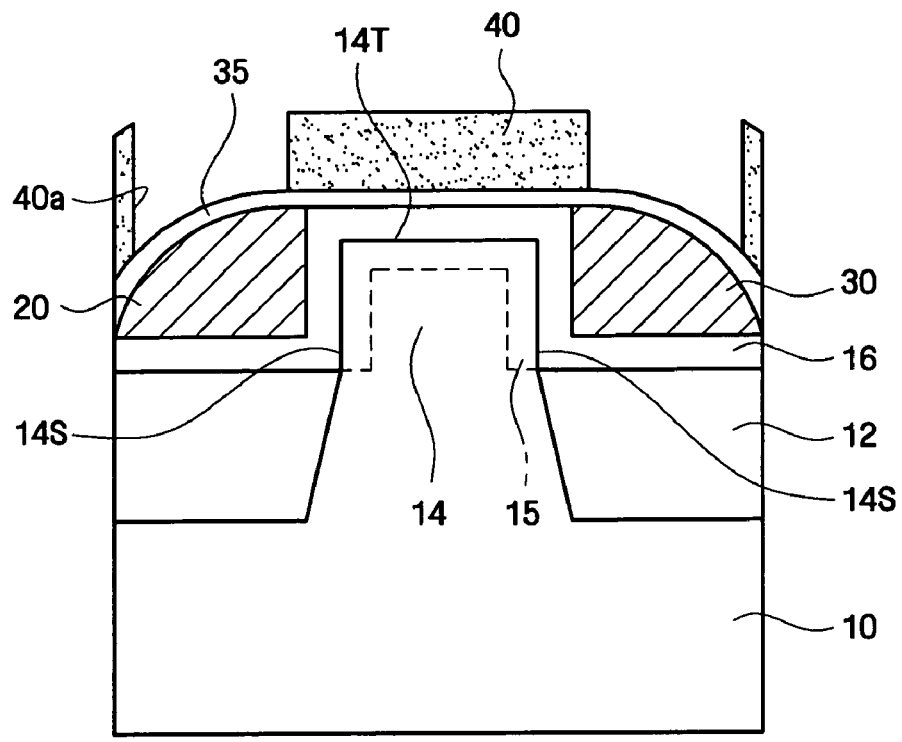
FIG. 3 is a cross-sectional view taken along line III-III' of FIG. 2.

FIGS. 2 and 3 are a perspective view and a cross-sectional view of a multi-bit nonvolatile memory cell according to an exemplary embodiment of the present invention.

Referring to FIGS. 2 and 3, the multi-bit nonvolatile memory cell includes three transistors forming a channel 15 on a substrate 10, a charge storage region 16, first through third control gates 20, 30, and 40 connected in parallel, and source/drain regions 47 and 48.

The substrate 10 is formed of at least one semiconductor material selected from the group consisting of but not limited to Si, Ge, SiGe, GaP, GaAs, SiC, SiGeC, InAs, and InP. In general, a main surface of the substrate 10 has a {100}-crystalline surface.

The channel 15 is formed to a predetermined depth from a semiconductor body 14 along the circumference of the semiconductor body 14. The semiconductor body 14 is defined by an isolation region 12 formed in the semiconductor substrate 10. The semiconductor body 14 is formed of a bulk semiconductor layer that protrudes in a mesa format to be higher than a top surface of the isolation region 12. Alternatively, the semiconductor body 14 can be formed of an epitaxial layer that protrudes in a mesa format on a bulk silicon pin formed to the same height as or lower than the height of the isolation region 12. Still further, a portion in which the channel 15 is formed can be formed of a bulk semiconductor layer formed by patterning, and a portion in which the source/drain regions 47 and 48 are formed can be formed of an epitaxial layer, a deposition-grown semiconductor layer, a local interconnection or the like.

When the semiconductor body 14 is formed of a bulk semiconductor layer, the semiconductor body 14 is preferably formed of the same material as the substrate 10.

When the semiconductor body 14 is formed of an epitaxial layer, the semiconductor body 14 is formed of Si, Ge, $Si_{1-x}Ge_x(0<x<1)$, $Si_{1-x}C_x(0<x<1)$ or $Si_{1-x-y}Ge_xC_y(0<x<1, 0<y<1)$, GaAs, InSb, GaP or a combination thereof. For improving the electrical characteristics of the memory cell, the semiconductor body 14 preferably has a single crystalline structure. A polycrystalline film is used for a device that does not require strict specifications like a liquid crystal display (LCD).

Further, it is also noted that Carrier-moving characteristics of the metal oxide semiconductor (MOS) transistor channel 15 may be affected by stress characteristics of a material used in forming the semiconductor body 14. For example, in the case of an negative channel metal oxide semiconductor (NMOS) transistor, when the semiconductor body 14 is formed of a material having a tensile stress, the movement characteristics of electrons used as a main carrier can be improved. On the other hand, in the case of a positive channel metal oxide semiconductor (PMOS) transistor, when the semiconductor body 14 is formed of a material having a compressive stress, the movement characteristics of holes used as a main carrier can be improved.

The semiconductor body 14 in this exemplary embodiment, is formed of a plurality of semiconductor layers having different band gaps. Each of the plurality of semiconductor layers is formed of the following materials including but not limited to Si, Ge, $Si_{1-x}Ge_x(0<x<1)$, $Si_{1-x}C_x(0<x<1)$ or $Si_{1-x-y}Ge_xC_y(0<x<1, 0<y<1)$, GaAs, InSb, GaP or a combination thereof. For example, when two semiconductor layers are formed, a lower layer of the semiconductor layer 14 may be an SiGe layer, and an upper layer thereof may be an Si layer. In this case, the source/drain regions 47 formed in the semiconductor body 14 are formed of a plurality of semiconductor layers having different band gaps.

In addition, the semiconductor body 14 may be formed of side walls 14S perpendicular to the main surface of the substrate 10 and a top surface 14T parallel to the main surface of the substrate 10. When the main surface of the substrate 10 has a {100}-crystalline surface, the side walls 14S may have a {111}-inclined surface, and the top surface 14T may have a {100}-inclined surface. If desired, an extended inclined surface may be further formed between the side walls 14S and the top surface 14T.

As shown in FIGS. 2 and 3, the charge storage region 16 may have a floating trap structure in which a tunneling insulating layer, a charge trap layer and a blocking insulating layer are stacked. Alternatively, the charge storage region 16 may have a floating gate structure in which a tunneling insulating layer, a floating gate and an intergate insulating layer are stacked.

The tunneling insulating layer is formed above the semiconductor body 14 and surrounds the channel region 15 of the semiconductor body 14. The tunneling insulating layer electrically insulates a space between the semiconductor body 14 and the charge trap layer or the floating gate, and even when power is not supplied, the tunneling insulating layer electrically isolates a carrier to prevent carrier leakage so that information can be retained.

$SiO_2$, SiON, $Si_3N_4$, $Ge_xO_yN_z$, $Ge_xSi_yO_z$ or a high dielectric material may be used for the tunneling insulating layer. Alternatively, a structure in which at least two kinds of materials selected from the above materials are sequentially stacked, may be used for the tunneling insulating layer.

An oxide layer is formed using at least one of the following techniques such as dry oxidation using an $O_2$ gas at 1000° C. to 1100° C., wet oxidation using a vapor atmosphere at 1000° C. to 1100° C., HCl oxidation using a mixed gas of an $O_2$ gas and a HCl gas, oxidation using a mixed gas of an $O_2$ gas and a $C_2H_3Cl_3$ gas or oxidation using a mixed gas of an $O_2$ gas and a $C_2H_2Cl_2$ gas.

In addition, the high dielectric material is formed in such a manner that $HfO_2$, $ZrO_2$, $Al_2O_3$, $Ta_2O_5$, hafnium silicate, zirconium silicate or a combination thereof is formed through atomic layer deposition. As the thickness of the tunneling insulating layer is reduced, a material having a high dielectric constant k should be used.

The tunnelling insulating layer 25 is formed to a thickness of 5 to 100 Å, and more preferably to a thickness of 5 to 50 Å.

A charge trap layer or a floating gate is formed above the tunnelling insulating layer and stores information by trapping charges. Thus, the charge trap layer of the floating gate surrounds the circumference of the tunnelling insulating layer. In the case of charge trap layers, the trapped charges do not move within the charge trap layer. Thus, the charge trap layers of each transistor of the memory cell do not need to be separated from one another. On the other hand, floating gates are preferably separated from one another on the side walls and top surface of the semiconductor body 14.

The charge trap layer may be formed of a nitride layer $Si_3N_4$ which has excellent retention characteristics with respect to charges.

The floating gate may be formed of $n^+$ polysilicon, $p^+$ polysilicon, SiGe or any other like material known in the art.

The blocking insulating layer is formed above the charge trap layer. The blocking insulating layer electrically insulates a space between the charge trap layer and the control gates 20, 30, and 40 formed on the charge trap layer to prevent charges trapped in the charge trap layer from leaking toward the control gates 20, 30, and 40. The integrated insulating layer is formed above the floating gate and electrically insulates a space between the floating gate and the control gates 20, 30, and 40.

$SiO_2$, $SiON$, $Si_3N_4$, $Ge_xO_yN_z$, $Ge_xSi_yO_z$ or a high dielectric material may be used for the blocking insulating layer or the integrated insulating layer. An oxide layer-based material is suitable for the blocking insulating layer. Methods such as for example, wet oxidation, HCl oxidation, oxidation using a mixed gas and the like may be used for forming the blocking insulating layer or the integrated insulating layer. Any other suitable methods known in the art may also be used. The blocking insulating layer or the integrated insulating layer are preferably formed to be slightly larger than the tunneling insulating layer 25 and to have a thickness of 10 to 500 Å, and more preferably a thickness of 5 to 100 Å.

The three control gates 20, 30, and 40 to which voltages are applied separately, are formed on the charge storage region 16. Moreover, the source/drain regions 47 and 48 are aligned on both sides of the control gates 20, 30, 40 and formed in the semiconductor body 14. The control gates 20, 30, and 40 include the sidewall control gates 20 and 30 formed on the sidewall 14S and the top surface control gate 40 formed on the top surface 14T.

When the current-driving forces of the sidewall control gates 20 and 30 and the top surface control gate 40 are the same, 2-bit storing can be performed as shown in Table 2.

When the current-driving forces of the three control gates 20, 30, and 40 are completely or partially different from one another, 3-bit or 2-bit storing can be performed as shown in Table 1 or 3. A current I driven by a transistor is obtained using Equation 1:

$$I = (1/L_{eff}) K (V_G - V_T), \quad (1)$$

where $L_{eff}$ is an effective channel length, K is an integer, $V_G$ is a gate voltage, and $V_T$ is a threshold voltage.

$L_{eff}$ is affected by the width of a gate electrode, and $V_T$ is affected by the thickness of a tunnelling insulating layer.

Thus, when the multi-bit non-volatile memory cell shown in FIGS. 2 and 3 is implemented by making the widths of the control gates 20, 30, and 40 different from one another, 3-bit or 2-bit storing can be performed as shown in Table 1. 3-bit or 2-bit storing can be easily implemented by varying the width and height of the semiconductor body 14 and the heights of the sidewall control gates 20 and 30.

In addition, when the main surface of the substrate 10 has a {100}-crystalline surface, the sidewall 14S has a {111}-inclined surface, and the top surface 14T has a {100}-inclined surface. In this case, the thickness of the tunnelling insulating layer formed on the sidewall 14S of the semiconductor body 14 and the thickness of the tunnelling insulating layer formed on the top surface 14T of the semiconductor body 14 may also be varied. Thus, one may vary the current-driving forces of the three transistors by changing the thicknesses of the tunnelling insulating layers and/or by varying the heights of the sidewall control gates 20 and 30, such that 3-bit or 2-bit storing can be performed as shown in Table 1.

In addition, 2-bit storing through 6-level current detection can be performed as shown in Table 3, when current-driving forces of the sidewall control gates 20 and 30 and the top surface control gate 40 are varied by changing the width and height of the semiconductor body 14 or when current-driving forces of the sidewall control gates 20 and 30 and the top surface control gate 40 are varied by changing the thicknesses of the tunnelling insulating layer formed on the sidewall 14S of the semiconductor body 14 and the tunnelling insulating layer formed on the top surface 14T of the semiconductor body 14.

An insulating layer 35 for insulation with the top surface control gate 40 formed on the sidewall control gates 20 and 30 is further formed on the top surfaces of the sidewall control gates 20 and 30. The insulating layer 35 may be an oxide layer. As shown in FIG. 3, the sidewall control gates 20 and 30 are formed in a spacer format or in a predetermined pattern by patterning a conductive layer. Alternatively, when the semiconductor body 14 is arranged adjacent in a cell array, the sidewall control gates 20 and 30 are formed in a damascene interconnection format in which a trench defined by a sidewall of the adjacent semiconductor body 14 is filled.

Further, an opening 40a is formed in the top surface control gate 40. The opening 40a provides a space for a contact. The contact is in turn connected to a word line for applying a separate voltage to the sidewall control gates 20 and 30.

The control gates 20, 30, and 40 may be formed of the following materials including but not limited to a conductive polysilicon layer, a metallic layer such as W, Pt or Al, a metallic nitride layer such as TiN, a metallic silicide layer obtained from a refractory metal such as Co, Ni, Ti, Hf or Pt or a layer obtained by stacking one or more of these refractory metals. For example, the control gates 20, 30, and 40 may be formed by sequentially stacking a conductive polysilicon layer and a metallic silicide layer or by sequentially stacking a conductive polysilicon layer and a metallic layer. The conductive polysilicon layer, is formed through low pressure chemical vapor deposition (LP CVD) using $SiH_2Cl_2$ and $PH_3$ gas.

The source/drain regions 47 and 48 are formed of n-type or p-type impurities depending upon the type of a non-volatile memory cell to be formed. In addition, the source/drain regions 47 and 48 may include a lightly doped drain (LDD) and a highly doped drain. However, by including an LDD, the source/drain regions 47 and 48 effectively prevent breakdown of the multi-bit non-volatile memory cell even when a high voltage is applied to the source/drain regions 47 and 48. In addition, the source/drain regions 47 and 48 may further include a halo region for organizing the thermal electrons more effectively when a program is run. The halo region is formed by doping opposite conductivity type impurities to be adjacent to the highly doped drain and the LDD.

Now the operation of the multi-bit non-volatile memory cell shown in FIGS. 2 and 3 will be explained.

First, when the program is operated, a voltage of about 5 to about 10V (e.g. 7V) is applied to a gate selected from the control gates 20, 30, and 40, a voltage of about 3 to about 6V (e.g. 6V) is applied to the drain region 48, and a ground voltage is applied to the source region 47, the substrate 10, and the remaining unselected gate. As such, thermal electrons generated in a channel of a saturated region between the source region 47 and the drain region 48 pass through the tunnelling insulating layer of the charge storage region 16 and are accumulated in the charge trap layer or the floating gate so that a threshold voltage of a selected transistor is shifted. That is, the program is executed using channel hot electron injection (CHEI).

During an erase operation, a voltage of about 10 to about 20V (e.g. 17V) is applied to the gate selected from the control gates 20, 30, and 40, and a ground voltage is applied to the other region. As such, the electrons that have been accumulated in the charge trap layer or the floating gate of the charge storage region 16 are discharged to the semiconductor body 14 via the tunnelling insulating layer induced by a voltage applied to the control gates 20, 30, and 40.

During a read operation, a read voltage(Vread) that is larger than a predetermined threshold voltage of transistors of the memory cell prior to programming and smaller than a threshold voltage of the programmed transistors, e.g., about 1 to about 2V is applied to the corresponding control gates 10, 20, and 30. Further, a ground voltage is applied to the source region 47, and an appropriate bias voltage of about 0.4 to about 1V is applied to the drain region 48 so that the formed drain current is detected, accumulation of electrons are sensed and stored data is read.

Figure 4:
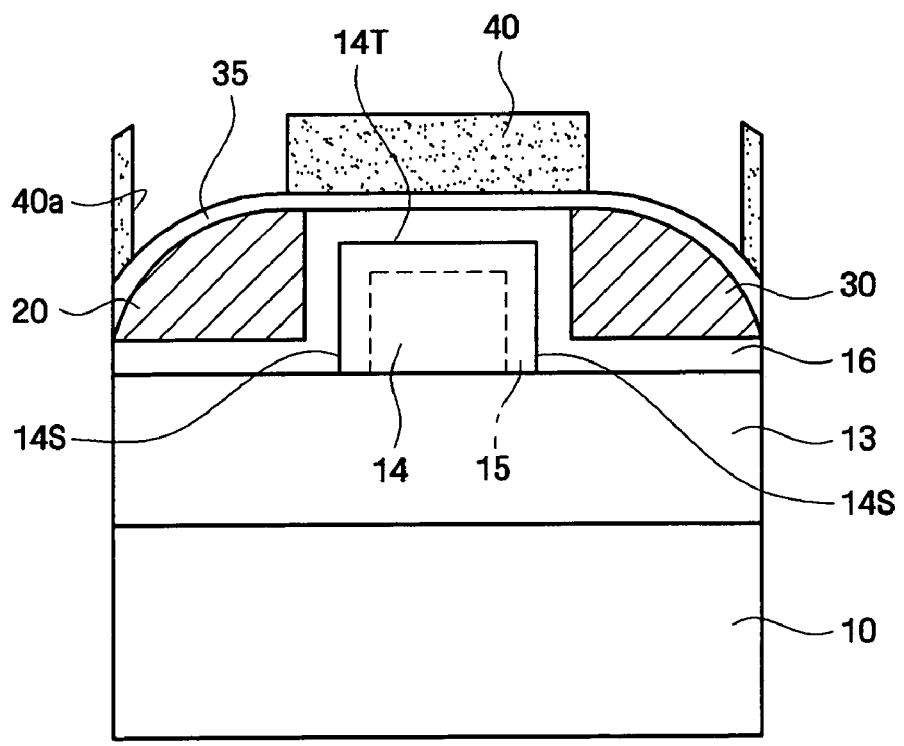
FIG. 4 is a cross-sectional view of a multi-bit nonvolatile memory cell of a semiconductor device according to an exemplary embodiment of the present invention.

FIG. 4 is a cross-sectional view of the multi-bit non-volatile memory cell according to another exemplary embodiment of the present invention. Referring to FIG. 4, the present exemplary embodiment is generally the same as the exemplary embodiment shown in FIGS. 2 and 3 except in that the semiconductor body 14 is not formed of a bulk silicon substrate but rather is a silicon layer formed on a buried oxide layer 13 of a silicon-on-insulator (SOI) substrate. The same reference numerals as those of the embodiment shown in FIGS. 2 and 3 denote the same elements, and a detailed description thereof is thus omitted.

Using the SOI substrate is preferable for improvement of drain induced barrier lowering (DIBL) characteristics. A substrate formed using a boding or separation by implantation of oxygen (SIMOX) method may be used for the SOI substrate. As shown in FIG. 4, the semiconductor body 14 may be formed of an SOI layer. Alternatively, the semiconductor body 14 may also be formed of a silicon pin formed of a patterned SOI silicon layer or an epitaxial layer formed on the silicon pin by selective epitaxial growth. In the case of using an epitaxial layer for forming the semiconductor body 14, the epitaxial layer may be formed of the following materials, including but not limited to Si, Ge, $Si_{1-x}Ge_x$ ($0<x<1$), $Si_{1-x}C_x$ ($0<x<1$) or $Si_{1-x-y}Ge_xC_y$ ($0<x<1$, $0<y<1$), GaAs, InSb, GaP or a combination thereof.

Figure 5:
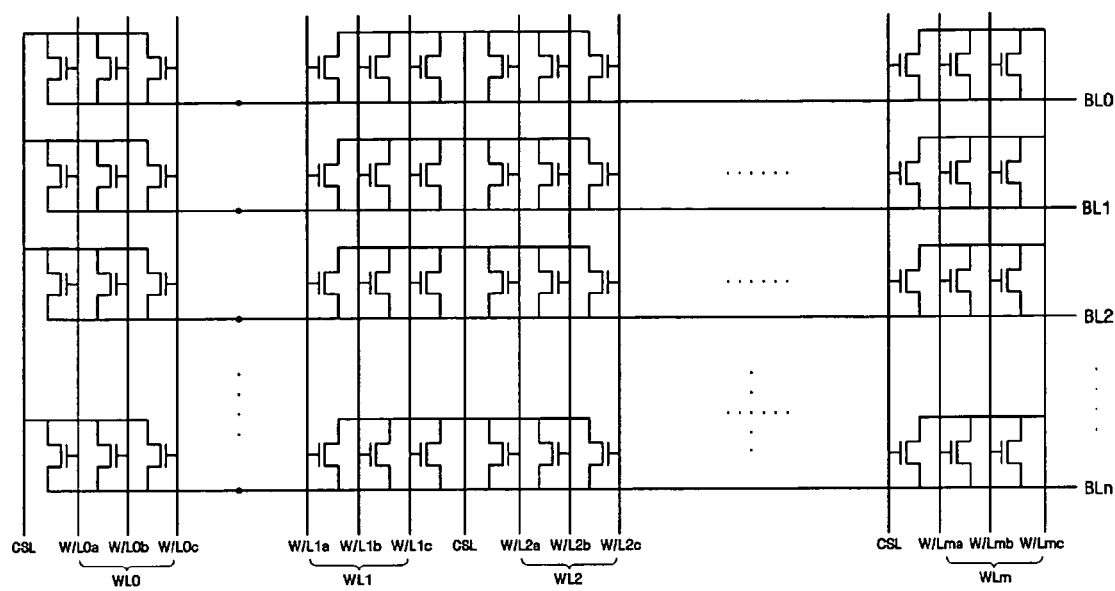
FIG. 5 is a partial equivalent circuit diagram of a cell array of a semiconductor device having multi-bit non-volatile memory cells according to an exemplary embodiment of the present invention.

FIG. 5 is a partial equivalent circuit diagram of a cell array of a semiconductor device having multi-bit non-volatile memory cells according to an exemplary embodiment of the present invention.

Referring to FIG. 5, the cell array of the non-volatile semiconductor device includes a plurality of multi-bit non-volatile memory cells arranged in a matrix format. Unit cells are disposed at a point in which a plurality of word lines WL0, WL1, WL2, . . . , and WLm arranged in a horizontal direction and a plurality of bit lines BL0, BL1, BL2, . . . , and BLn arranged in a vertical direction cross with one another. As three transistors are included in each memory cell of this exemplary embodiment, three corresponding word lines WLa, WLb, and WLc are also included for defining each unit cell. In addition, a common source line (CSL) arranged in a horizontal direction is included in the cell array. Two unit cells have one CSL, and the two unit cells are symmetrical with one another about the CSL. Thus, a pair of unit cells share a source region so that the overall size of the non-volatile memory cell is effectively reduced.

Figure 6:
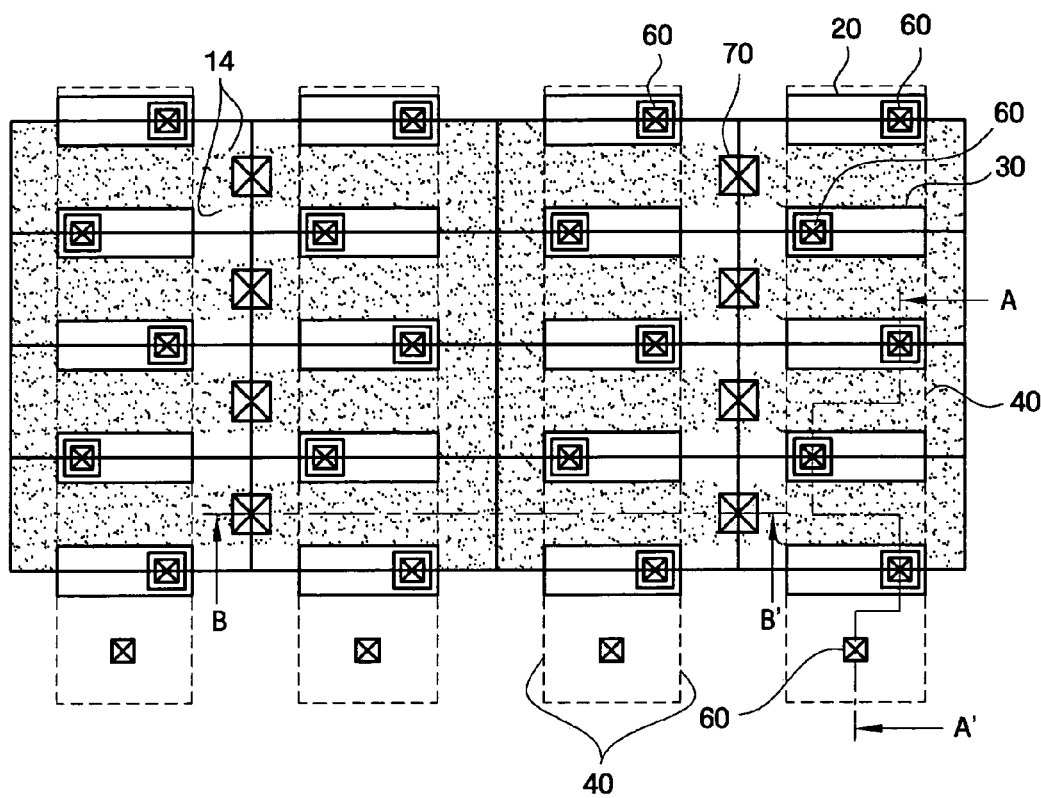
FIG. 6 is a layout diagram for implementing the equivalent circuit diagram of FIG. 5.
Figure 7A:
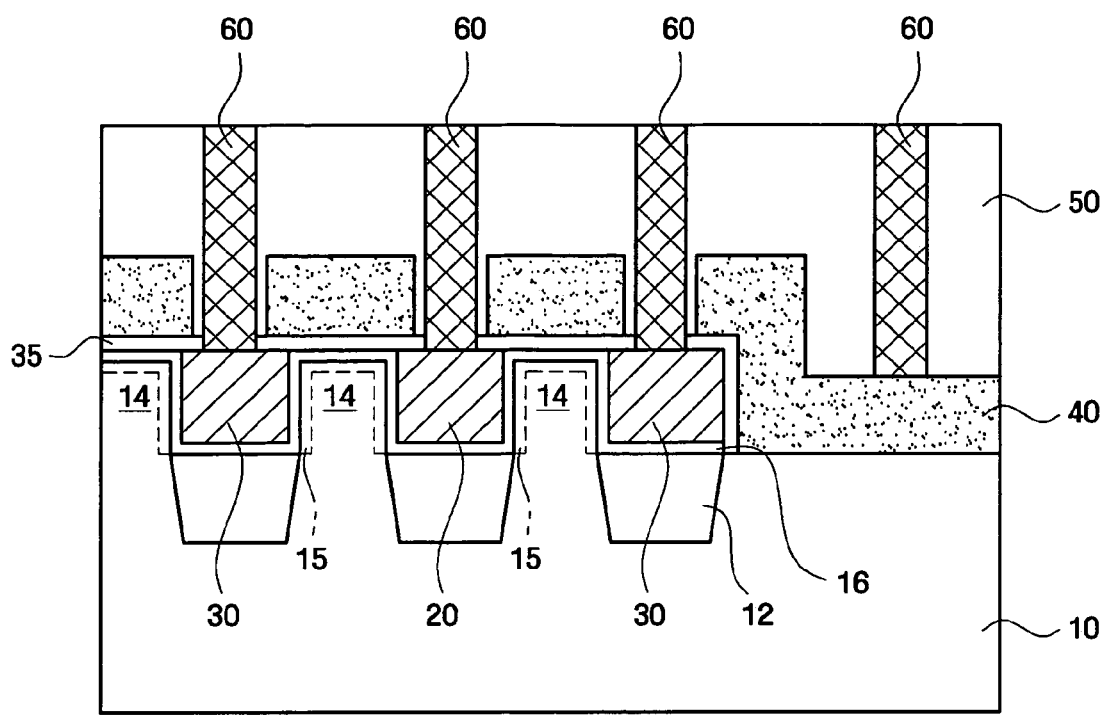
FIGS. 7A and 7B are cross-sectional views taken along lines A-A' and B-B' of FIG. 6.
Figure 7B:
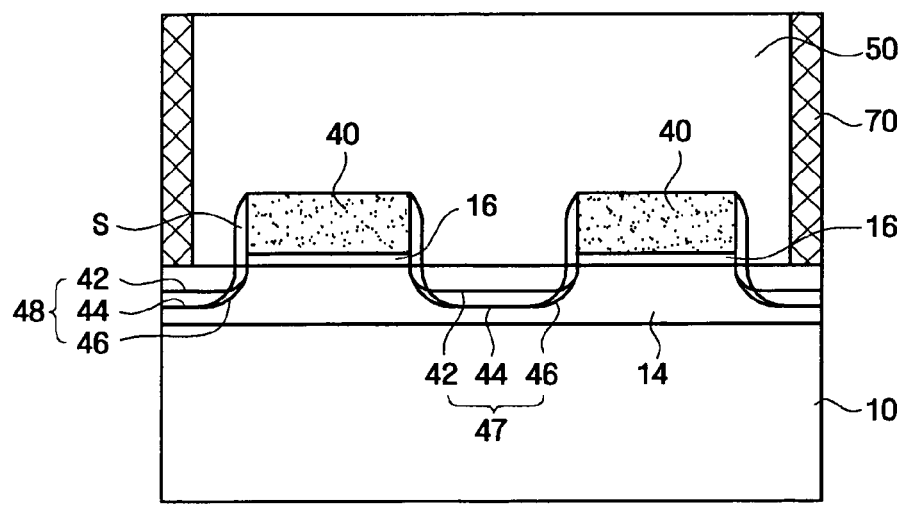

FIG. 6 is a layout diagram for implementing the equivalent circuit diagram of FIG. 5, FIG. 7A is a cross-sectional view taken along line A-A' of FIG. 6, and FIG. 7B is a cross-sectional view taken along line B-B' of FIG. 6, which are composed of the memory cell shown in FIGS. 2 and 3.

Referring to FIGS. 6 through 7B, the cell array of the non-volatile semiconductor device is formed in an active region formed by the semiconductor body 14. The semiconductor body 14 is defined by the isolation region 12 in the substrate 10. A first plurality of semiconductor bodies 14 extend in a first direction, such as for example, in a horizontal direction and are formed in parallel, and a second plurality of semiconductor bodies 14 extend in a direction perpendicular to the first direction, such as for example, in a vertical direction. The above-mentioned semiconductor bodies 14 cross with one another in a vertical direction and are formed in a grid type format.

Channel 15 is formed to a predetermined depth from the surface of the semiconductor bodies 14 along the circumference of the semiconductor bodies 14 that extend in the first direction.

The charge storage region 16 surrounds the channel 15.

Moreover, the sidewall control gates 20 and 30 are aligned on the sidewall of the semiconductor bodies 14 parallel to the first direction. As mentioned above when describing the memory cell, the sidewall control gates 20 and 30 may be formed in a spacer format or a simple patterned format. As shown in FIGS. 6 through 7B, when the semiconductor bodies 14 are arranged adjacent to one another, forming the semiconductor bodies 14 in a damascene format in which a trench T defined by sidewalls of the semiconductor bodies 14 is filled, is preferable in view of planarization. The top surface control gate 40 is insulated from the sidewall control gates 20 and 30 by an insulating layer 35 formed on the top surface of the sidewall control gates 20 and 30. The top surface control gate 40 is overlapped with the sidewall control gates 20 and 30 and extends in another direction, e.g. a vertical direction, from the sidewall control gates 20, 30.

The control gates 20, 30, and 40 are connected to each of word lines WLa, WLb, and WLc shown in FIG. 5. Thus, opening 40a formed in the top surface control gate 40, provides a space for contact 60. Contact 60 is in turn connected to a word line for applying a separate voltage to the sidewall control gates 20 and 30. In this case, arranging the opening 40a along one top surface control gate 40, in a vertical direction in a zigzag format is done for optimizing the arrangement of the word lines.

The interlevel dielectric layer 50 is formed on the top surface control gate 40. The sidewall control gates 20 and 30 are connected to corresponding word lines via the contact 60 formed through the interlevel dielectric layer 50 and the insulating layer 35. The top surface control gate 40 is connected to an upper interconnection via one contact 60 arranged on the outer circumference of the cell array.

N-type or p-type impurities are doped in the source/drain regions 47 and 48 depending upon the type of a non-volatile memory cell to be formed. Further, the source/drain regions 47 and 48 may include a lightly doped drain (LDD) 42, a highly doped drain 44, and a halo region 46. In the above situation, a spacer S may further be formed on the sidewalls of the control gates 20, 30, and 40.

In addition, a pair of nonvolatile memory cells are formed in the memory cell array. The pair of nonvolatile memory cells share a source region 47, thereby effectively reducing the overall size of the non-volatile memory cell. The source region 47 is formed at a cross point of the semiconductor bodies 14 having a grid format.

Reference numeral 70 denotes a bit line contact.

A method of fabricating a memory cell array shown in FIGS. 7A and 7B will now be described with reference to FIGS. 8 through 12.

Figure 8:
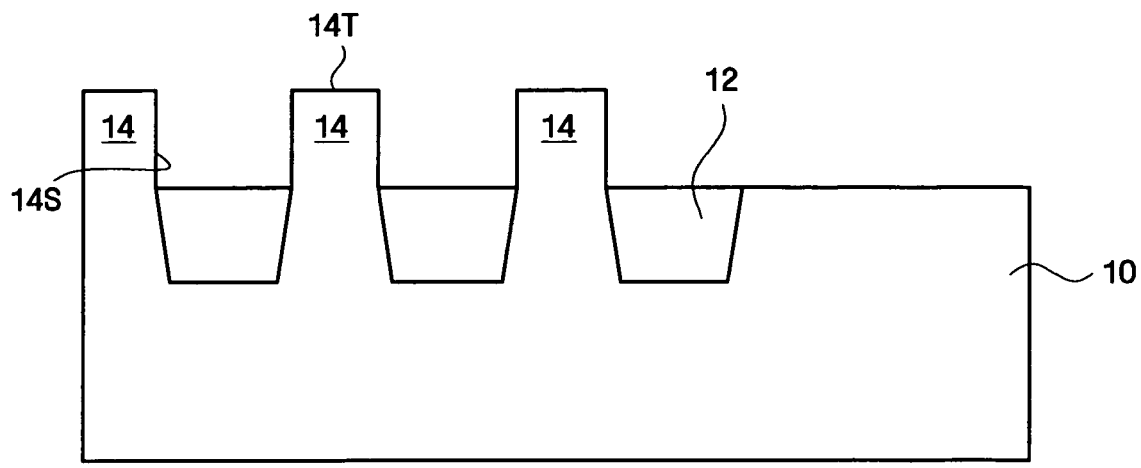
FIGS. 8 through 12 are cross-sectional views illustrating a method of fabricating a semiconductor device shown in FIGS. 7A and 7B.

Referring to FIG. 8, first, a substrate 10 is prepared. The substrate 10 may be formed of at least one semiconductor material selected from the group including but not limited to Si, Ge, SiGe, GaP, GaAs, SiC, SiGeC, InAs or InP. The substrate 10 may be a silicon substrate having a top surface of {100}-crystalline surface.

A semiconductor body 14 is formed by a process of defining a general isolation region 12.

The semiconductor body 14 has both-side walls 14S formed perpendicularly to a main surface of the substrate 10, and a top surface 14T formed parallel to the main surface of the substrate 10. Further, a trench is defined by the semiconductor body 14.

The semiconductor body 14 may be formed by etching a silicon layer of a bulk silicon substrate or an SOI substrate. Alternatively, the semiconductor body 14 may be formed by forming a bulk silicon pin to a height which is the same as or smaller than the height of the isolation region 12, and then forming an epitaxial layer that protrudes in a mesa format by an epitaxial growth process, thereby forming the three-dimensional semiconductor body 14.

Additionally, in forming the semiconductor body 14, a selective epitaxial growth technology such as molecular beam epitaxi (MBE), ultra high vacuum chemical vapor deposition (UHV CVD), reduced pressure chemical vapor deposition (RP CVD) or rapid thermal chemical vapor deposition (RT CVD) may be used. For example, in the present exemplary embodiment, a RP CVD method is used.

Moreover, when forming the semiconductor body 14 using a selective epitaxial growth method, $Si_2H_6$, $SiH_4$, $SiH_2Cl_2$, $SiHCl_3$ or $SiCl_4$ or the like may be used as an Si source. In addition $GeH_4$ may be used as a Ge source. Further, $C_2H_6$ or $CH_3SiH_3$ or the like may be used as a C source.

Further, for improving selective epitaxial growth characteristics, a gas such as HCl or $Cl_2$ may be added to a source gas. It is noted that when adding HCl or $Cl_2$ gas to the source gas, an epitaxial growth layer does not form in a region in which an oxide layer or a nitride layer is formed, but rather selective epitaxial growth occurs only in a region in which a semiconductor layer, for example, an Si layer is formed.

Specifically, when the semiconductor body 14 is formed of an Si layer, crystalline growth is performed at about 700° C. to about 900° C. under about 10 to about 20 torr. In this case, a source gas $SiH_2Cl_2$ is supplied in units of about 100 to about 200 standard cubic centimeters per minute (sccm). HCl in units of about 0 to about 100 sccm, $B_2H_6$ in units of about 0 to about 100 sccm, and $PH_3$ in units of about 0 to about 100 sccm may be added to the source gas $SiH_2Cl_2$. In this case, $H_2$ in units of about 10 to about 35 standard liters per minute (slm) may be supplied as a carrier gas. When the semiconductor body 14 is formed of an $Si_{1-x}Ge_x$ layer, crystalline growth is performed at about 500° C. to about 750° C. under about 10 to about 20 torr. In this case, the source gases $SiH_2Cl_2$ and $GeH_4$ are supplied in units of about 100 to about 200 sccm and units of about 50 to about 200 sccm, respectively. HCl in units of about 0 to about 100 sccm, $B_2H_6$ in units of about 0 to about 100 sccm, and $PH_3$ in units of about 0 to about 100 sccm may be added to the source gas $SiH_2Cl_2$ and $GeH_4$. In this case, $H_2$ in units of 10 to about 35 slm may be supplied as a carrier gas. When the semiconductor body 14 is formed of an $Si_{1-x}C_x$ layer, crystalline growth is performed at about 650° C. to about 850° C. under about 10 to about 20 torr. In this case, the source gases $SiH_2Cl_2$ and $CH_3SiH_3$ are supplied in units of about 100 to about 200 sccm and about 5 to about 50 sccm, respectively. HCl supplied in units of about 0 to about 100 sccm, $B_2H_6$ supplied in units of about 0 to about 100 sccm, and $PH_3$ supplied in units of about 0 to about 100 sccm may be added to the source gas $SiH_2Cl_2$ and $CH_3SiH_3$. In this case, $H_2$ of about 10 to about 35 slm may be supplied as a carrier gas. In addition, the semiconductor body 14 may be formed of a plurality of semiconductor layers having different band gaps. For example, when forming the semiconductor body 14, an SiGe layer is first formed on a semiconductor pin using a selective epitaxial growth method, and an Si layer is grown on the SiGe layer. Alternatively, only a portion of the area in which the channel 15 is formed is formed by patterning a bulk semiconductor layer, and in addition a portion of the area in which the source/drain regions 47 and 48 are formed, are formed of an epitaxi layer, a deposition-grown semiconductor layer, and a local interconnection or the like.

A method of forming the source/drain regions 47 and 48 as an epitaxi layer to complete the semiconductor body 14 is disclosed in Korean Patent Laid-open Publication No. 2004-0008148 commonly assigned to an assignee of the present application, and the description of this application is incorporated by reference herein in it's entirety.

A method of completing the semiconductor body 14 using a semiconductor layer or a local interconnection is disclosed in Korean Patent Laid-open Publication Nos. 2004-0010472 and 2004-0058257 commonly assigned to an assignee of the present application, and the description of this application is incorporated by reference herein in its entirety.

Figure 9:
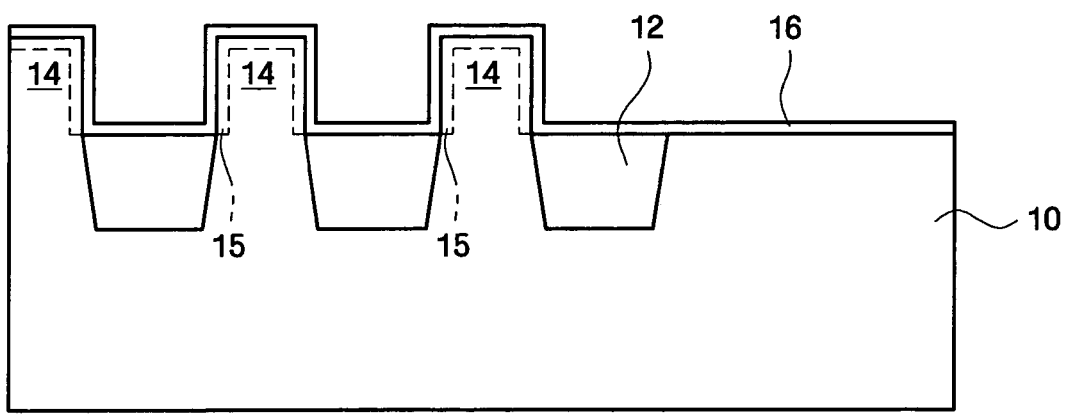

In addition, using an alternating phase inversion mask in a region in which the channel 15 is formed may be adapted to form the semiconductor body 14 having a small pitch. This is disclosed in Korean Patent Laid-open Publication No. 2004-0073081 commonly assigned to an assignee of the present application, and the description of this application is incorporated by reference in its entirety. Referring to FIG. 9, impurities are ion-implanted into the semiconductor body 14 if desired to perform doping on the channel 15 for adjusting threshold voltage, i.e. $V_T$. After that, a charge storage region 16 is formed on the surface of the semiconductor body 14. The charge storage region 16 may have a floating trap structure in which a tunneling insulating layer, a charge trap layer and a blocking insulating layer are stacked, or alternatively a floating gate structure in which a tunneling insulating layer, a floating gate and an intergate insulating layer are stacked. The tunneling insulating layer may be formed by growing a desired layer from the surface of the semiconductor body 14 through for example, methods such as wet oxidation, HCl oxidation or oxidation using a mixed gas. Alternatively, the tunneling insulating layer may be formed using CVD or atomic layer deposition (ALD). For example, the tunneling insulating layer may be formed of the following material including but not limited to $SiO_2$, SiON, $Si_3N_4$, $Ge_xO_yN_z$ or $Ge_xSi_yO_z$ or a high dielectric material such as $HfO_2$, $ZrO_2$, $Al_2O_3$, $Ta_2O_5$, hafnium zirconium silicate or a combination thereof. In addition, the tunneling insulating layer may be formed by stacking at least two kinds of materials selected from the above-mentioned materials as a plurality of layers. Subsequently, a charge trap layer or a floating gate is formed on the tunneling insulating layer. The charge trap layer may be formed by stacking a nitride layer $Si_3N_4$ using nitridation. The floating gate may be formed by depositing $n^+$ polysilicon, $p^+$ polysilicon, SiGe, or any other suitable material known in the art. Subsequently, a blocking layer or an integrated insulating layer is formed. The blocking layer or the integrated insulating layer is formed preferably using the same method as the tunneling insulating layer. Preferably, the blocking layer or the integrated insulating layer is formed to a larger thickness than the tunneling insulating layer.

Figure 10:
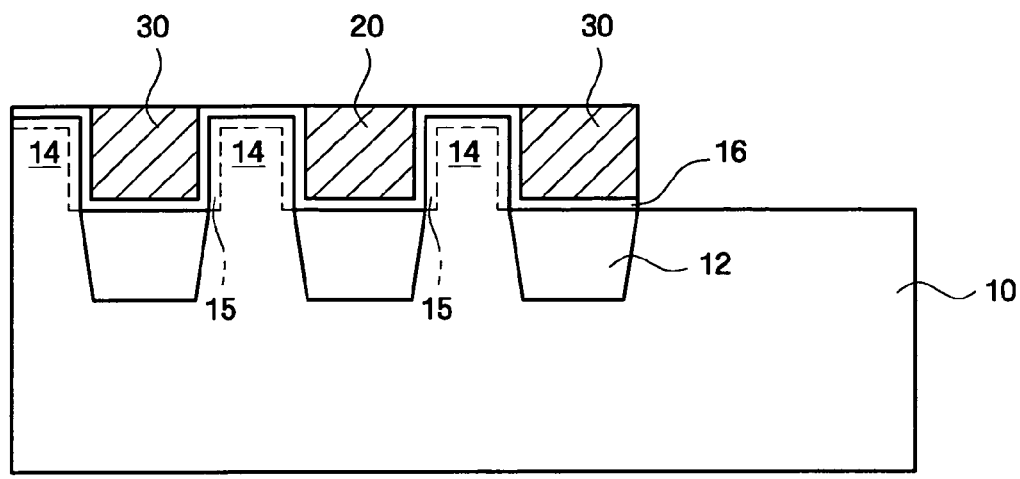
Figure 11:
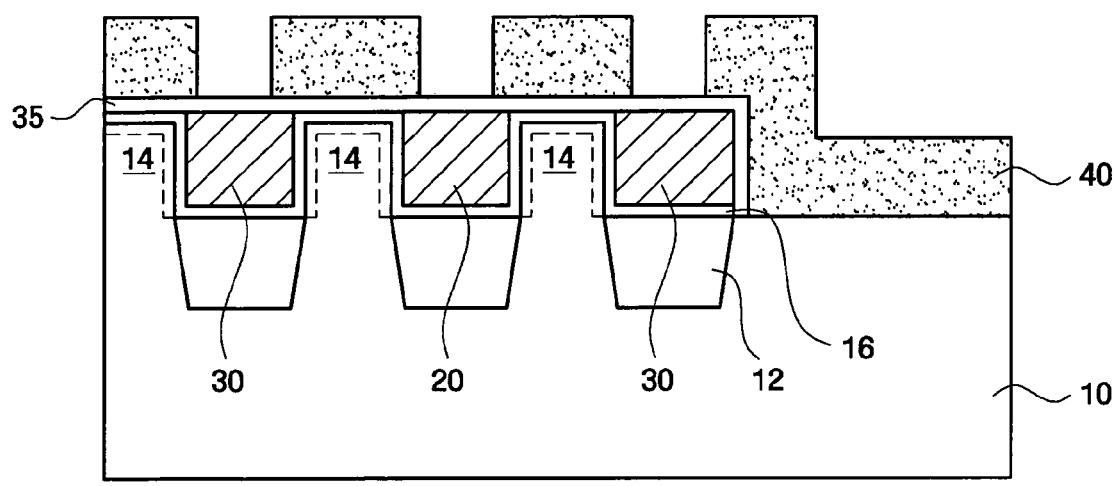

Referring to FIG. 10, a conductive layer is formed on the charge storage region 15 and planarized, and then sidewall control gates 20 and 30 are formed. The conductive layer may be formed of a conductive polysilicon layer, a metallic layer, a metallic nitride layer, a metallic silicide layer, or a combination of these layers. The conductive layer is generally formed using LP CVD. In this case, for filling a trench region defined by the semiconductor body 14, a deposition thickness for the conductive layer is provided which is more than double the width of a trench. The deposited conductive layer is planarized, for example, by an etchback process using plasma etching equipment using an etch gas such as HBr, $Cl_2$, $CClF_3$, $CCl_4$, $NF_3$ or $SF_6$ or the like, or by a chemical mechanical polishing process, thereby forming sidewall control gates 20 and 30 that are aligned on the sidewall of the semiconductor body 14 and not separated from an adjacent cell. Referring now to FIG. 1, the insulating layer 35 is formed on the sidewall control gates 20 and 30 by forming an oxide layer on the sidewall control gates 20 and 30 via an oxidation process. Subsequently, a conductive layer is formed on the entire surface of the insulating layer 35 and then patterned to form a top surface control gate 40. The top surface control gate 40 is patterned so that the region in which a common source region 47 and a drain region 48 are to be formed parallel to a common source line CSL is exposed. Further, when patterning the top surface control gate 40, the sidewall control gates 20 and 30 which are formed below the top surface control gate 40 are separated from each other to form individual cells. The conductive layer forming the top surface control gate 40 may be formed of a polysilicon layer, a metallic layer, a metallic nitride layer, a metallic silicide layer, or a combination of these layers, generally using LP CVD techniques.

Figure 12:
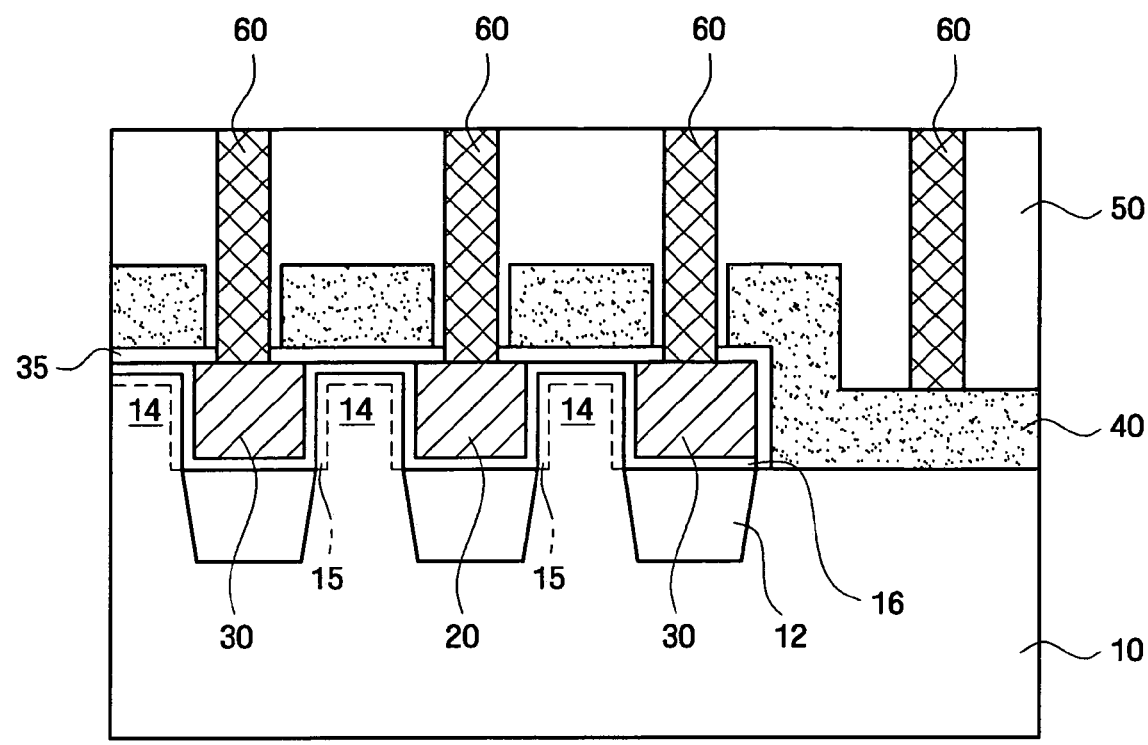

A spacer may be formed on the sidewalls of the control gates 20, 30, and 40. Referring to FIG. 12, an ion implantation process and an annealing process are performed to form the source/drain regions 47 and 48. If desired, a metallic silicide layer such as Wsix, CoSix or TiSix may be formed on the top surface control gate 40 and the top surface of the source/drain regions 47 and 48 by performing a conventional salicide process.

Subsequently, an interlevel dielectric layer 50 is formed, and a contact 60 that contacts the sidewall control gates 20 and 30 and the top surface control gate 40 is formed. A subsequent semiconductor device fabrication process, e.g. a conventional fabrication process, is performed so that a semiconductor device having a multi-bit nonvolatile memory cell is produced.

As described above, in the multi-bit nonvolatile memory cell according to at least one exemplary embodiment the present invention, a high integration of flash EEPROM and lower cost per Mbyte is effectively achieved.

In addition, since the multi-bit nonvolatile memory cell of at least one exemplary embodiment of the present invention has the same operation allowable window as a single bit nonvolatile memory cell, the reliability of a semiconductor device is maintained and also the yield of the semiconductor device having the multi-bit nonvolatile memory cell is maintained.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A nonvolatile semiconductor device comprising:
   a multi-bit nonvolatile memory unit cell, the unit cell comprising:
      a semiconductor body being formed on a substrate and extending in a first direction;
      a channel region formed in the semiconductor body along a circumference of the semiconductor body;
      a charge storage region formed on the channel region;
      a plurality of control gates, which are formed on the charge storage region and wherein each of the plurality of control gates is adapted to receive separate control voltages; and
      source and drain regions aligned on both sides of the plurality of control gates and formed in the semiconductor body.

2. The nonvolatile semiconductor device of claim 1, wherein the semiconductor body protrudes in a mesa format having side walls formed substantially perpendicular to a main surface of the substrate and a top surface formed substantially parallel to the main surface of the substrate.

3. The nonvolatile semiconductor device of claim 2, wherein the plurality of control gates comprise two side-wall control gates aligned on the side walls of the semiconductor body and a top surface control gate formed on the top surface of th semiconductor body.

4. The nonvolatile semiconductor device of claim 3, wherein a current-driving force of the sidewall control gates and a current-driving force of the top control gate are different from each other.

5. The nonvolatile semiconductor device of claim 4, wherein the current-driving forces of the two sidewall control gates are different from one another.

6. The nonvolatile semiconductor device of claim 5, wherein the current detected from the drain region has 0 to 7 levels.

7. The nonvolatile semiconductor device of claim 6, wherein the multi-bit nonvolatile memory unit cell is a 2 bit or 3 bit memory unit cell.

8. The nonvolatile semiconductor device of claim 5, wherein a height of the sidewalls of the semiconductor body and a width of the top surface of the semiconductor body are different from each other, and widths of the sidewall control gates each different from each other.

9. The nonvolatile semiconductor device of claim 5, wherein a thickness of a tunneling insulating layer constituting a charge storage region below the sidewall control gate and a thickness of the tunneling insulating layer constituting a charge storage region below the top surface control gate are different from each other, and widths of the two sidewall control gates are different from each other.

10. The nonvolatile semiconductor device of claim 4, wherein current-driving forces of the two sidewall control gates are the same.

11. The nonvolatile semiconductor device of claim 10, wherein the current detected from the drain region has 0 to 5 levels.

12. The nonvolatile semiconductor device of claim 11, wherein the multi-bit non-volatile memory unit cell is a 2 bit memory unit cell.

13. The nonvolatile semiconductor device of claim 10, wherein a height of the sidewalls of the semiconductor body and a width of the top surface are different from each other.

14. The nonvolatile semiconductor device of claim 10, wherein a thickness of a tunneling insulating layer below the sidewall control gates and a thickness of a tunneling insulating layer below the top surface control gate are different from each other.

15. The nonvolatile semiconductor device of claim 3, wherein a current-driving forces of each of the sidewall control gates and a current-driving force of the top surface control gate are the same.

16. The nonvolatile semiconductor device of claim 3, wherein an insulating layer is further formed on top surfaces of the sidewall control gates and the top surface control gates overlap with the top surfaces of the sidewall control gates.

17. The nonvolatile semiconductor device of claim 16, wherein the top surface control gate comprises an opening for exposing the insulating layer on the top surfaces of the sidewall control gates.

18. The nonvolatile semiconductor device of claim 16, wherein the sidewall control gates are respectively formed in a spacer form.

19. The nonvolatile e semiconductor device of claim 16, wherein the sidewall control gates are damascene interconnections formed on the sidewalls of the semiconductor body.

20. The nonvolatile semiconductor device of claim 1, wherein the charge storage region comprises a floating trap structure or a floating gate structure.

21. The nonvolatile semiconductor device of claim 20, wherein the floating trapstructure is a stack structure in which a tunneling insulating layer, a charge trap layer, and a blocking insulating layer are stacked.

22. The nonvolatile semiconductor device of claim 1, further comprising another unit cell sharing the source region, wherein the unit cells are symmetrical with each other about the source region.

* * * * *